(12) United States Patent
Tamaki et al.

(10) Patent No.: US 12,581,175 B2
(45) Date of Patent: Mar. 17, 2026

(54) CAMERA MODULE, CONTROL METHOD THEREFOR, AND MANUFACTURING METHOD THEREFOR

(71) Applicant: NIPPON CHEMI-CON CORPORATION, Tokyo (JP)

(72) Inventors: Katsuya Tamaki, Tokyo (JP); Masahiro Komiya, Tokyo (JP); Naohisa Shibata, Tokyo (JP)

(73) Assignee: NIPPON CHEMI-CON CORPORATION, Tokyo (JP)

( * ) Notice: Subject to any disclaimer, the term of this patent is extended or adjusted under 35 U.S.C. 154(b) by 143 days.

(21) Appl. No.: 18/427,991

(22) Filed: Jan. 31, 2024

(65) Prior Publication Data

US 2024/0276084 A1 Aug. 15, 2024

(30) Foreign Application Priority Data

Feb. 13, 2023 (JP) ................................. 2023-019664
Feb. 13, 2023 (JP) ................................. 2023-019665

(51) Int. Cl.
| | |
|---|---|
| *H01L 23/52* | (2006.01) |
| *H02H 5/04* | (2006.01) |
| *H04N 23/52* | (2023.01) |
| *H05K 1/02* | (2006.01) |

(52) U.S. Cl.
CPC .............. *H04N 23/52* (2023.01); *H02H 5/04* (2013.01); *H05K 1/0201* (2013.01); *H05K 2201/10121* (2013.01); *H05K 2201/10151* (2013.01)

(58) Field of Classification Search
CPC ......... G01J 1/0403; G02B 7/08; G03B 30/00; G01S 7/4813; H04N 13/239; H04N 23/51; H04N 23/52; H04N 23/55; H02H 5/04; H05K 1/0201–0212; H05K 7/20136; H05K 7/20145; H05K 7/20209; H05K 7/20409; H05K 7/20963; H05K 7/20972
See application file for complete search history.

(56) References Cited

U.S. PATENT DOCUMENTS

| | | | |
|---|---|---|---|
| 2017/0038459 A1* | 2/2017 | Kubacki | G01S 17/36 |
| 2018/0059246 A1* | 3/2018 | Buettgen | G01S 7/4813 |
| 2019/0187254 A1* | 6/2019 | Kappel | G01S 7/4808 |
| 2020/0271765 A1* | 8/2020 | Glover | G01S 7/4876 |
| 2022/0070340 A1* | 3/2022 | Kim | H04N 23/57 |
| 2022/0082663 A1* | 3/2022 | Chou | G01S 17/10 |
| 2023/0200004 A1* | 6/2023 | Watanabe | H04R 1/326 |
| | | | 381/91 |
| 2024/0004034 A1* | 1/2024 | Chen | G01S 7/4813 |
| 2025/0123363 A1* | 4/2025 | Lee | G03B 17/55 |

FOREIGN PATENT DOCUMENTS

| | | | | |
|---|---|---|---|---|
| CN | 114706092 A | * | 7/2022 | ............. G01S 17/48 |
| JP | 2010-170486 A | | 8/2010 | |
| JP | 2011-66560 A | | 3/2011 | |

OTHER PUBLICATIONS

CN-114706092-A English Translation (Year: 2022).*

* cited by examiner

*Primary Examiner* — Amir A Jalali
(74) *Attorney, Agent, or Firm* — WHDA, LLP

(57) ABSTRACT

A camera module includes, for example, a light source, a ToF sensor configured to detect reflected light from a subject that receives light from the light source, and a heat conduction member that conducts heat of the light source to the ToF sensor.

15 Claims, 8 Drawing Sheets

CAMERA MODULE, CONTROL METHOD THEREFOR, AND MANUFACTURING METHOD THEREFOR

CROSS-REFERENCE TO RELATED APPLICATIONS

This application is entitled to the benefit of priority of Japanese Patent Application No. 2023-019664, filed on Feb. 13, 2023, and Japanese Patent Application No. 2023-019665, filed on Feb. 13, 2023, the contents of which are hereby incorporated by reference.

BACKGROUND OF THE INVENTION i) Field of the Invention

The present disclosure relates to, for example, an electronic device such as a camera module including a time of flight (ToF) sensor, a control method thereof, and a manufacturing method thereof.

II) Description of the Related Art

In an electronic device that is affected by an outside air temperature or the like, it is already known that the temperature drop impairs a normal operation, and that the temperature of the electronic device is retained to ensure a normal operation.

Regarding such an electronic device, it is disclosed that a heat sink is attached on a substrate, a heater is provided on the heat sink, and reliable activation and stable operation of the electronic device are enabled even at a low temperature (For example, JP 2010-170486 A).

Regarding a camera module, it is disclosed that a heat transfer wire is disposed inside an outer wall of a lens holder to heat or retain the temperature of the entire camera module (For example, JP 2011-66560 A).

BRIEF SUMMARY OF THE INVENTION

Meanwhile, in the camera module on which the ToF sensor is mounted, a normal operation cannot be obtained when the temperature of the ToF sensor falls below the operable range. In the imaging experiment in which the ToF sensor is maintained in a low temperature environment, for example, it has been confirmed that the acquired image is disturbed at a temperature of about 10 [° C.], the detection operation becomes unstable at 0 [° C.] or less, and image collapse occurs as if there is unevenness on the subject surface even when a planar subject is imaged at a low temperature of about −10 [° C.].

As described above, even when the temperature condition under which the function of the electronic device such as the camera module normally works is satisfied, the sensor function of the ToF sensor is affected at a low temperature, and malfunction occurs. That is, there is a problem that, depending on the temperature characteristics of the sensor mounted on the electronic device, practicality is impaired when the ToF sensor is affected at a low temperature.

According to a first aspect of the present disclosure, a camera module includes: a light source configured to emit light and generate heat; a ToF sensor configured to detect reflected light from a subject that receives the light from the light source; and a heat conduction member that conducts the heat of the light source to the ToF sensor.

According to a second aspect of the present disclosure, a method for controlling a camera module includes: emitting light and generating heat by a light source; detecting reflected light from a subject by a ToF sensor; conducting the heat of the light source to the ToF sensor by a heat conduction member; detecting a temperature of the ToF sensor or detecting an ambient temperature of the ToF sensor by a temperature sensor; and controlling, by a control unit, the temperature of the ToF sensor or the ambient temperature of the ToF sensor to a predetermined temperature or a predetermined temperature range by increasing or decreasing a heat generation amount of the light source according to a detection temperature of the temperature sensor.

According to a third aspect of the present disclosure, a method for manufacturing a camera module includes: forming a heat conduction member including a first surrounding wall for surrounding a ToF sensor and a heat receiving portion for receiving heat of a light source; and disposing a first circuit board on the first surrounding wall so as to position the ToF sensor in the first surrounding wall, or disposing a second circuit board including the light source on the heat receiving portion.

BRIEF DESCRIPTION OF THE SEVERAL VIEWS OF THE DRAWING

FIG. 1 is a partial cross-sectional view illustrating a camera module according to a first embodiment.

FIG. 4 is a partial cross-sectional view illustrating a camera module according to a second embodiment.

DETAILED DESCRIPTION OF THE INVENTION

First Embodiment

Figure 1:
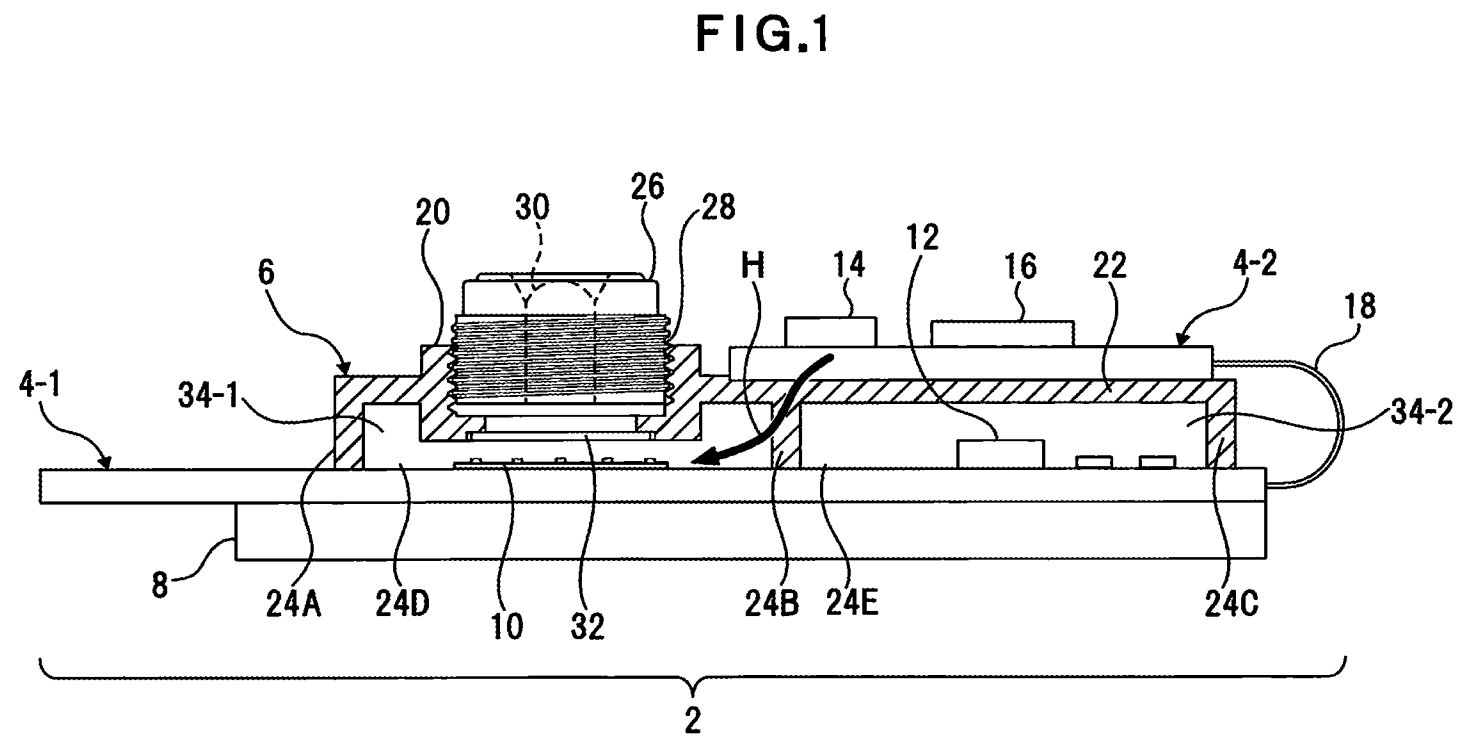
Figure 2:
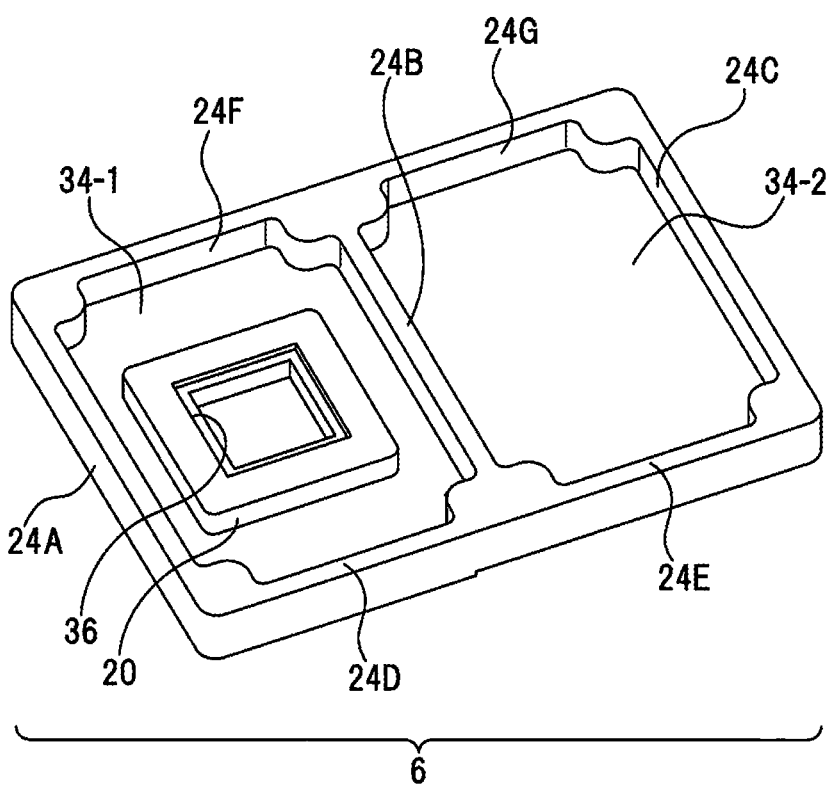
FIG. 2 is a perspective view illustrating a lens holder from the back surface side.

FIG. 1 illustrates a partial section of a camera module according to a first embodiment of the present disclosure. The configuration illustrated in FIG. 1 is an example of the present disclosure, and the present disclosure is not limited to such a configuration.

A camera module 2 illustrated in FIG. 1 is an example of an electronic device of the present disclosure. The camera module 2 includes a first circuit board 4-1, a second circuit board 4-2, a lens holder 6, and a heat sink 8. The first circuit board 4-1, the second circuit board 4-2, and the heat sink 8 are integrally fixed to the lens holder 6 by fastening means such as a plurality of screws.

The first circuit board 4-1 is an example of a sensor board. A ToF sensor 10, a microcomputer (hereinafter simply referred to as "computer") 12, and the like are mounted in the first circuit board 4-1. The ToF sensor 10 is an example of a first element whose function deteriorates at a low temperature. The ToF sensor 10 has a function of detecting reflected light from a subject (not illustrated) and imaging the subject. The computer 12 is an example of a control unit of the camera module 2, and processing by the control unit includes signal processing including image processing of acquiring imaging representing a subject from a detection output of the ToF sensor 10.

The second circuit board 4-2 is an example of a vertical cavity surface emitting laser (VCSEL) board. A light source 14, a light source driver 16, and the like are mounted in the second circuit board 4-2. The light source 14 is an example of a second element that generates heat during operation. As the light source 14, for example, a VCSEL element for emitting VCSEL is used. For example, the light source driver 16 drives the light source 14 by a drive pulse, and turns on and off the light source 14 by pulse driving at an arbitrary cycle. The second circuit board 4-2 is electrically connected to the first circuit board 4-1 by a wiring member 18.

The lens holder 6 is an example of a heat conduction member of the present disclosure. For the heat conduction member, for example, an aluminum material or an alloy material containing aluminum as a metal material having excellent thermal conductivity, a hard resin material, or the like is used. The lens holder 6 has thermal conductivity and rigidity for maintaining positional accuracy of components such as the ToF sensor 10 and the light source 14. It is preferable to reduce the weight of the lens holder 6.

The lens holder 6 includes a holder portion 20, a board mounting portion 22, and a plurality of vertical wall portions 24A, 24B, 24C, 24D, 24E, 24F, and 24G (FIG. 2). The vertical wall portions 24A, 24B, 24C, 24D, 24E, 24F, and 24G are set at the same height or substantially the same height, for example.

The holder portion 20 is a cylindrical portion penetrating the lens holder 6 between the front and back surfaces. A lens unit 26 is slidably attached to the holder portion 20 by a sliding mechanism 28. The sliding mechanism 28 includes, for example, a screw portion on the holder portion 20 side and a screw portion on the lens unit 26 side. The lens unit 26 includes an optical lens 30, and condenses reflected light from a subject by the optical lens 30 to form a subject image on an imaging surface of the ToF sensor 10. In this case, an optical filter 32 installed on the terminal end side of the holder portion 20 is used to adjust the amount of reflected light and the passing wavelength range of the reflected light.

The board mounting portion 22 is an example of a heat receiving portion of the present disclosure. The board mounting portion 22 is a heat receiving area that receives heat from the light source 14 mounted in the second circuit board 4-2. The board mounting portion 22 includes a flat surface portion to be brought into close contact with the second circuit board 4-2. Therefore, the second circuit board 4-2 is closely attached to the board mounting portion 22, and the board mounting portion 22 receives the heat H of the light source 14 mounted in the second circuit board 4-2. The heat H received by the board mounting portion 22 is conducted to the ToF sensor 10 side by the thermal conductivity of the lens holder 6 including the heat conduction member.

The vertical wall portions 24A, 24B, 24D, and 24F are examples of a first surrounding wall of the present disclosure. The vertical wall portions 24A, 24B, 24D, and 24F surround the side surface side of the ToF sensor 10, the first circuit board 4-1 covers the bottom surface side of the ToF sensor 10, and the lens holder 6 covers the upper surface side of the ToF sensor 10. That is, the plurality of vertical wall portions 24A, 24B, 24D, and 24F, the first circuit board 4-1, the lens holder 6, and the optical lens 30 constitute a first heat retention chamber 34-1 for retaining the temperature of the ToF sensor 10 and the mounting portion of the ToF sensor 10. In addition, the lens holder 6 integrally including the vertical wall portions 24A, 24B, 24D, and 24F functions to prevent incidence of noise light on the ToF sensor 10.

The vertical wall portions 24B, 24C, 24E, and 24G are examples of the second surrounding wall of the present disclosure. The vertical wall portions 24B, 24C, 24E, and 24G surround the side surface side of the computer 12, the first circuit board 4-1 covers the bottom surface side of the computer 12, and the lens holder 6 covers the upper surface side of the computer 12. That is, the plurality of vertical wall portions 24B, 24C, 24E, and 24G, the first circuit board 4-1, and the lens holder 6 constitute a second heat retention chamber 34-2 for retaining the temperature of the computer 12.

The lens holder 6 is disposed on the front surface of the first circuit board 4-1, and the heat sink 8 is installed on the back surface of the first circuit board 4-1. A heat conduction member is used for the heat sink 8 similarly to the lens holder 6. The heat dissipation of the heat sink 8 suppresses overheating of the first heat retention chamber 34-1 and the second heat retention chamber 34-2.

<Heat Retention Mechanism of ToF Sensor 10>

FIG. 2 illustrates the lens holder 6 as viewed from the back surface side. In FIG. 2, the same parts as those in FIG. 1 are denoted by the same reference signs.

The first heat retention chamber 34-1 includes the vertical wall portions 24A, 24B, 24D, and 24F, the first circuit board 4-1, the lens holder 6, and the optical lens 30 illustrated in FIG. 1 to constitute an enclosed space. That is, the optical lens 30 is included in the sealing member that seals the first heat retention chamber 34-1. A plate-shaped optical filter 32 (FIG. 1) is installed in the optical filter attachment portion 36 formed in the holder portion 20. The optical filter 32 closes the holder portion 20, and the first heat retention chamber 34-1 constitutes the enclosed space. That is, the optical filter 32 is included in the sealing member that seals the first heat retention chamber 34-1. Therefore, the air is confined in the first heat retention chamber 34-1 together with the ToF sensor 10, and the air in the first heat retention chamber 34-1 functions as a heat storage unit that stores the heat H received in contact with the lens holder 6.

The second heat retention chamber 34-2 includes the vertical wall portions 24B, 24C, 24E, and 24G, the first circuit board 4-1 and the lens holder 6 illustrated in FIG. 1 to constitute an enclosed space. That is, the air is confined in the second heat retention chamber 34-2 together with the computer 12, and the air in the second heat retention chamber 34-2 functions as a heat storage unit that stores the heat H received in contact with the lens holder 6. As a result, the temperatures of the computer 12 and the mounting portion of the computer 12 are retained.

<Relationship Between Light Emission Mode and Heat Generation of Light Source 14>

Figure 3:
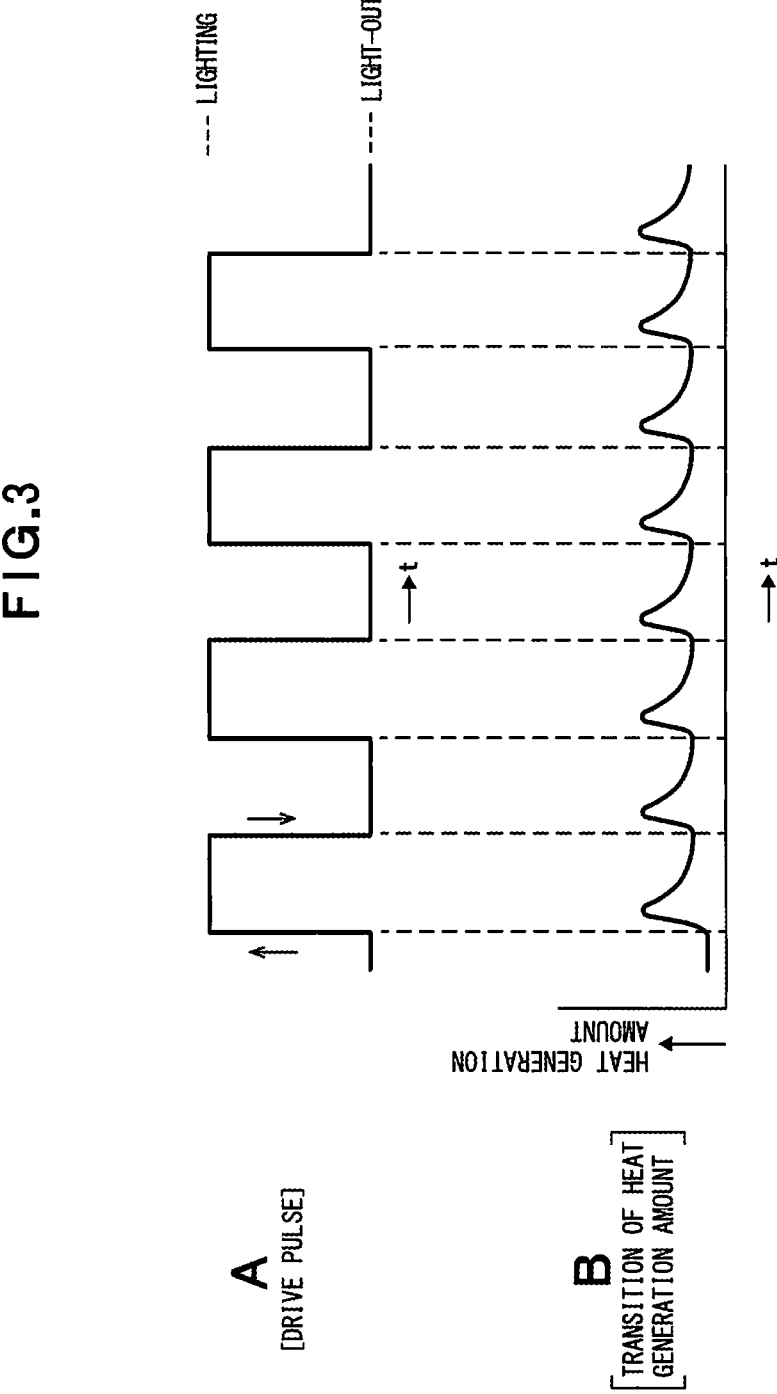
FIG. 3 is a diagram illustrating a drive pulse and a transition of a heat generation amount of a light source.

A of FIG. 3 illustrates a drive pulse of the light source 14. The light emission mode by the drive pulse is an example, and the present disclosure is not limited to this light emission mode. The pulse light emission of the light source 14 by the drive pulse is an example of a light emission mode in which the light source 14 is blinked by the drive pulse that oscillates between on and off at a constant cycle from the light source driver 16.

B of FIG. 3 illustrates a transition of the heat generation amount of the light source 14. When a light emission of the VCSEL element used for the light source 14 is pulsed, a remarkable heat generation amount is obtained in the light source 14 due to a switching loss generated in a transient time from light-out state to lighting state or a switching time (transient time) from the lighting state to the light-out state. The heat H generated by the heat generation is transferred from the light source 14 to the lens holder 6 via the second circuit board 4-2.

<Example of Manufacturing Process of Camera Module 2>

The manufacturing process of the camera module 2 is an example of a method for manufacturing the camera module of the present disclosure. This manufacturing process includes a processing process of the lens holder 6, a board attachment process, and the like.

In the processing process of the lens holder 6, the lens holder 6 including the vertical wall portions 24A, 24B, 24D, and 24F (first surrounding walls) for surrounding the ToF sensor 10 and the board mounting portion 22 (heat receiving portion) for receiving the heat H of the light source 14 is formed by molding, cleaving, cutting, or the like of the heat conduction member.

The board attachment process includes a process of disposing the first circuit board 4-1 on the first surrounding wall so as to position the ToF sensor 10 in the first surrounding wall, or a process of disposing the second circuit board 4-2 including the light source 14 on the board mounting portion 22 (heat receiving portion).

Effects of First Embodiment

According to the first embodiment, any one of the following effects can be obtained.

(1) The light source 14 can be utilized as a heat retaining heat source.

The light source 14 is a light emitting unit for emitting light to irradiate a subject. Since heat generated by the original function is utilized as a heat retaining heat source, it is not necessary to install a new heat source. This can contribute to simplification, multi-functionality or weight reduction of the module.

(2) Pulse-driven light emission can be utilized as a light emission mode of the light source 14.

It is possible to obtain heat H required as a heat retaining heat source by utilizing intermittent light emission by pulse driving without impairing the light emission mode of the light source 14.

(3) Heat conduction by the heat conduction member can be used.

The lens holder 6 is a base material on which the lens unit 26 is mounted, and a heat conduction member is used for the lens holder 6. Therefore, the lens holder 6, which is a mounting member of the lens unit 26, can receive the heat H from the light source 14, and efficiently conduct the heat H to the ToF sensor 10 side. That is, multifunctionalization of the lens holder 6 can be achieved.

(4) The heat storage property, heat retention property, and detection accuracy can be improved.

The ToF sensor 10 and the computer 12 can be efficiently retained at a certain temperature or higher by utilizing the lens holder 6 constituting the first heat retention chamber 34-1 and the second heat retention chamber 34-2 and the heat storage property of the air confined in the first heat retention chamber 34-1 and the second heat retention chamber 34-2, and malfunction such as disturbance of a detection image due to temperature decrease of the ToF sensor 10 can be prevented, and detection accuracy can be enhanced.

(5) The operation temperature range of the camera module 2 can be expanded.

By retaining the temperature of the ToF sensor 10, the reliability of the sensor function of the ToF sensor 10 can be enhanced, the temperature dependence of the camera module 2 by the ToF sensor 10 can be alleviated, and the range of the operation temperature of the camera module 2 can be expanded.

(6) The heat dissipation of the heat sink 8 can be used.

Since the temperature of each of the first heat retention chamber 34-1 and the second heat retention chamber 34-2 is optimized by the heat dissipation of the heat sink 8 in combination with the temperature retention by the heat H from the light source 14, the reliability of the operation can be obtained together with the expansion of the range of the operation temperature of the camera module 2.

(7) The camera module 2 can be enhanced by the robustness of the camera module 2.

Since the first circuit board 4-1 and the second circuit board 4-2 are attached to the lens holder 6 formed of a heat conduction member having high rigidity, and the first circuit board 4-1 and the second circuit board 4-2 are disposed with the lens holder 6 interposed therebetween, the robustness of the camera module 2 can be enhanced.

Since the lens holder 6 has the box-shaped housing structure including the vertical wall portions 24A, 24B, 24D, and 24F (first surrounding wall) and the vertical wall portions 24B, 24C, 24E, and 24G (second surrounding wall), a strong support frame structure can be realized together with the rigidity of the heat conduction member.

According to the lens holder 6 including the vertical wall portions 24A, 24B, 24D, and 24F (first surrounding walls) surrounding the ToF sensor 10, reliability of the sensor function can be enhanced, for example, noise light on the ToF sensor 10 can be blocked, and detection accuracy of reflected light from a subject can be enhanced.

(8) The installation accuracy of the ToF sensor 10 and the light source 14 can be improved.

Since the camera module 2 includes the lens holder 6 having the plurality of vertical wall portions 24A, 24B, 24D, and 24F (first surrounding wall) and the plurality of vertical wall portions 24B, 24C, 24E, and 24G (second surrounding wall), parallel accuracy of the first circuit board 4-1 and the second circuit board 4-2 can be obtained, and installation accuracy of the ToF sensor 10 and the light source 14 can be enhanced.

(9) The camera module 2 can be made compact.

The heat conduction structure can be realized using the lens holder 6, and the camera module 2 can be made compact.

(10) The ToF sensor can be optimized by the disposition of the first heat retention chamber 34-1 and the light source 14.

Since the temperature of the ToF sensor is retained together with the temperature of the first heat retention chamber 34-1 by the heat from the light source 14 disposed in the vicinity of the first heat retention chamber 34-1, the temperature retention can be optimized without excessively heating the ToF sensor.

Second Embodiment

Figure 4:
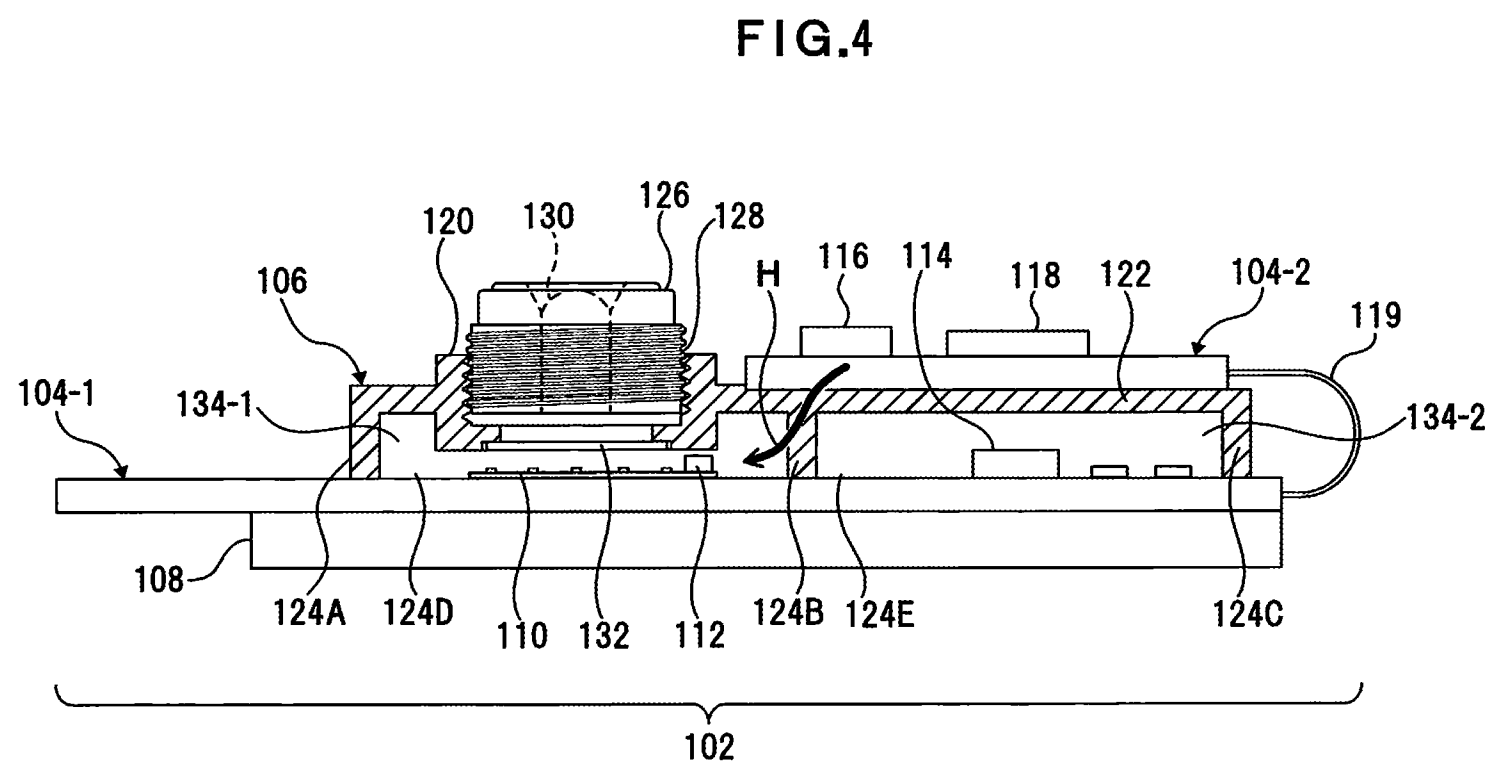

FIG. 4 illustrates a partial section of a camera module according to a second embodiment of the present disclosure. The configuration illustrated in FIG. 4 is an example, and the present disclosure is not limited to such a configuration.

A camera module 102 illustrated in FIG. 4 is an example of an electronic device of the present disclosure. The camera module 102 includes a first circuit board 104-1, a second circuit board 104-2, a lens holder 106, and a heat sink 108. The first circuit board 104-1, the second circuit board 104-2, and the heat sink 108 are integrally fixed to the lens holder 106 by fastening means such as a plurality of screws.

The first circuit board 104-1 is an example of a sensor board. A ToF sensor 110, a temperature sensor 112, a computer 114, and the like are mounted in the first circuit board 104-1. The ToF sensor 110 is an example of a first element whose function deteriorates at a low temperature. The ToF sensor 110 has a function of detecting reflected light from a subject (not illustrated) and imaging the subject.

The temperature sensor 112 detects the temperature of the ToF sensor 110 or the ambient temperature of the ToF sensor 110 and provides a detection output (that is, the temperature data) of the temperature or the ambient temperature to the computer 114. The computer 114 is an example of a control unit of the present disclosure. The computer 114 receives the detection output of the temperature sensor 112, and controls the temperature of the ToF sensor 110 or the ambient temperature of the ToF sensor 110 in addition to signal processing including image processing of acquiring imaging indicating a subject.

The first circuit board 104-1 is disposed on the lower surface side of the lens holder 106, and the second circuit board 104-2 sandwiching the lens holder 106 with the first circuit board 104-1 is installed. That is, the first circuit board 104-1, the second circuit board 104-2, and the lens holder 106 have a stacked structure.

The second circuit board 104-2 is an example of a VCSEL board. A light source 116, a light source driver 118, and the like are mounted in the second circuit board 104-2. The light source 116 is an example of a second element that generates heat during operation. As the light source 116, for example, a VCSEL element for emitting VCSEL is used. The light source driver 118 drives the light source 116. For example, the light source driver 118 drives the light source 116 by a drive pulse, and turns on and off the light source 116 by pulse driving at an arbitrary cycle. The second circuit board 104-2 is electrically connected to the first circuit board 104-1 by a wiring member 119.

The lens holder 106 shown in cross section in the figure is an example of a heat conduction member of the present disclosure. For the heat conduction member, for example, an aluminum material or an alloy material containing aluminum as a metal material having excellent thermal conductivity, a hard resin material, or the like is used. The lens holder 106 has thermal conductivity and rigidity for maintaining positional accuracy of components such as the ToF sensor 110 and the light source 116. It is preferable to reduce the weight of the lens holder 106.

Figure 5:
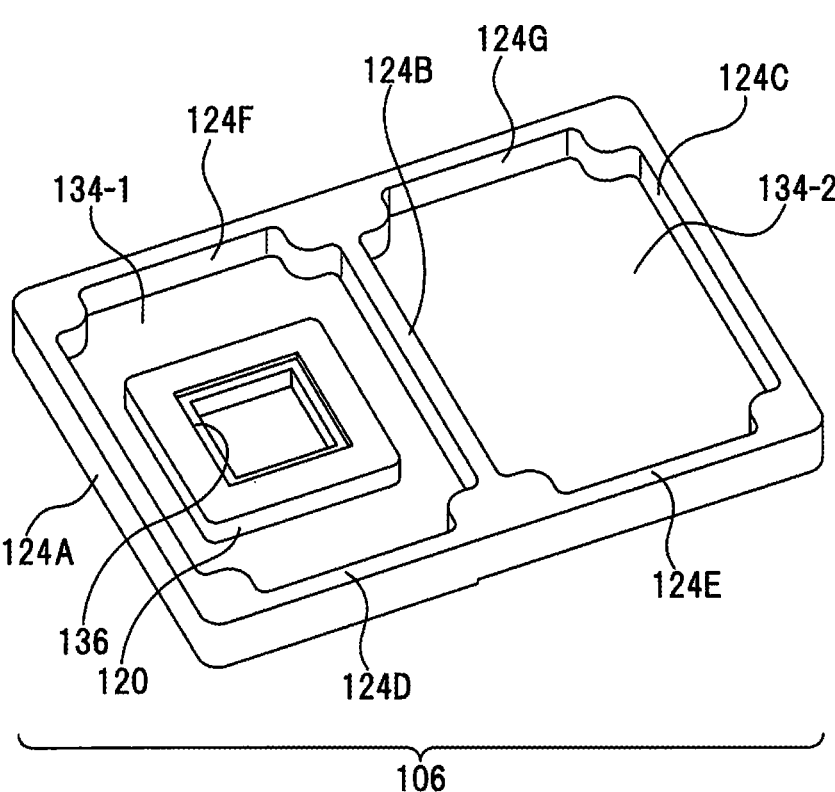
FIG. 5 is a perspective view illustrating a lens holder as viewed from the back surface side.

The lens holder 106 includes a holder portion 120, optical filter attachment portion 136, a board mounting portion 122, and a plurality of vertical wall portions 124A, 124B, 124C, 124D, 124E, 124F, and 24G (FIG. 5). The vertical wall portions 124A, 124B, 124C, 124D, 124E, 124F, and 124G are set at the same height or substantially the same height, for example.

The holder portion 120 is integrally formed in the lens holder 106 and is a cylindrical portion penetrating the lens holder 106 between the front and back surfaces. A lens unit 126 is slidably attached to the holder portion 120 by a sliding mechanism 128. The sliding mechanism 128 is constituted by, for example, a screw portion on the holder portion 120 side and a screw portion on the lens unit 126 side. The lens unit 126 includes an optical lens 130, and condenses reflected light from a subject by the optical lens 130 to form a subject image on an imaging surface of the ToF sensor 110.

In this case, an optical filter 132 installed on the terminal end side of the holder portion 120 is used to adjust the amount of reflected light and the passing wavelength range of the reflected light.

The board mounting portion 122 is an example of a heat receiving portion of the present disclosure. The board mounting portion 122 is a heat receiving area that receives heat from the light source 116 mounted in the second circuit board 104-2. The board mounting portion 122 includes a flat surface portion to be brought into close contact with the second circuit board 104-2. Therefore, the second circuit board 104-2 is closely attached to the board mounting portion 122, and the board mounting portion 122 receives the heat H of the light source 116 mounted in the second circuit board 104-2. The heat H received by the board mounting portion 122 is conducted to the ToF sensor 110 side by the thermal conductivity of the lens holder 106 including the heat conduction member.

The vertical wall portions 124A, 124B, 124D, and 124F are examples of a first surrounding wall of the present disclosure. The vertical wall portions 124A, 124B, 124D, and 124F surround the side surface side of the ToF sensor 110, the first circuit board 104-1 covers the bottom surface side of the ToF sensor 110, and the lens holder 106 covers the upper surface side of the ToF sensor 110. That is, the plurality of vertical wall portions 124A, 124B, 124D, and 124F, the first circuit board 104-1, the lens holder 106, and the optical lens 130 constitute a first heat retention chamber 134-1 for retaining the temperature of the ToF sensor 110 and the mounting portion of the ToF sensor 110. In addition, the lens holder 106 integrally including the vertical wall portions 124A, 124B, 124D, and 124F functions to prevent incidence of noise light on the ToF sensor 110.

The vertical wall portions 124B, 124C, 124E, and 124G are examples of the second surrounding wall of the present disclosure. The vertical wall portions 124B, 124C, 124E, and 124G surround the side surface side of the computer 114, the first circuit board 104-1 covers the bottom surface side of the computer 114, and the lens holder 106 covers the upper surface side of the computer 114. That is, the plurality of vertical wall portions 124B, 124C, 124E, and 124G, the first circuit board 104-1, and the lens holder 106 constitute a second heat retention chamber 134-2 for retaining the temperature of the computer 114.

The heat sink 108 is installed on the back surface of the first circuit board 104-1 on which the lens holder 106 is disposed. A heat conduction member is used for the heat sink 108 similarly to the lens holder 106. The heat dissipation of the heat sink 108 suppresses overheating of the first heat retention chamber 134-1 and the second heat retention chamber 134-2.

<Control System 138 of Camera Module 102>

Figure 6:
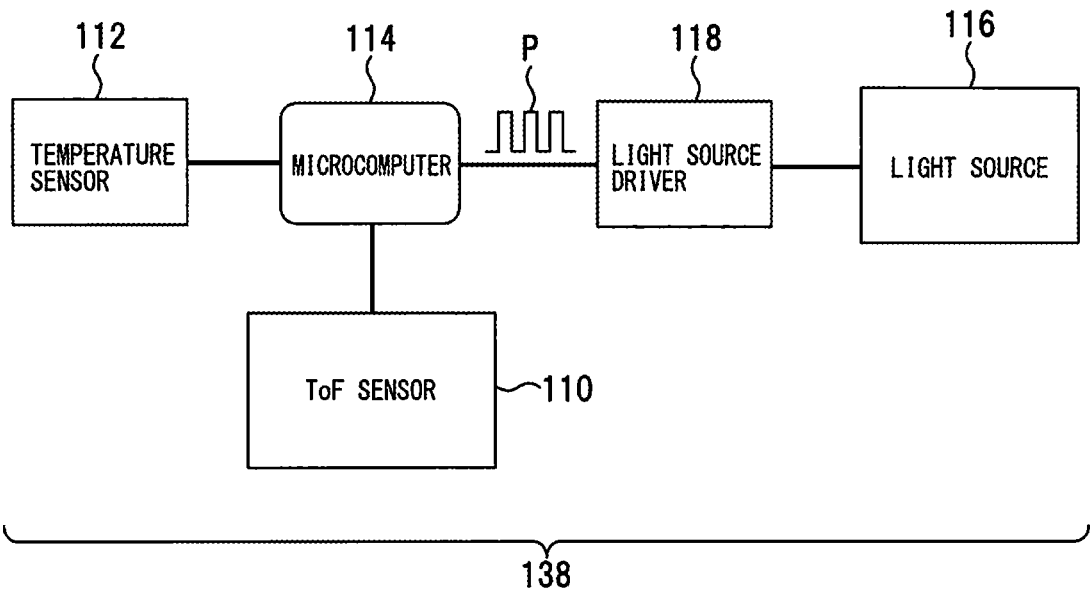
FIG. 6 is a diagram illustrating an example of a control system of a ToF sensor.

FIG. 6 illustrates a control system 138 of the camera module 102 according to the second embodiment. The control system 138 is an example of a control system of the present disclosure. In FIG. 6, the same parts as those in FIG. 4 are denoted by the same reference signs.

The control system 138 is a control function provided together with pulse light emission control of the light source 116. The control system 138 of the present embodiment includes a ToF sensor 110, a temperature sensor 112, a computer 114, a light source 116, and a light source driver 118.

The detection output of the ToF sensor 110 is provided to the computer 114 and used for image processing. The temperature sensor 112 is installed adjacent to the ToF sensor 110 to detect a temperature of the ToF sensor 110 or the ambient temperature of the ToF sensor 110, and provides a detection output of the temperature or its ambient temperature to the computer 114.

The computer 114 executes information processing in the control system 138 together with light emission control of the light source 116. The computer 114 includes a processor, a memory, an input/output unit, and the like (not illustrated). The processor executes a program in the memory, and executes generation of a drive pulse, light emission control, control, and the like. The memory stores programs such as an operating system (OS) and a database. The input/output unit is used to acquire temperature data and output a drive pulse under the control of the processor. The information processing for the control including the temperature control by the computer 114 includes control of the pulse width of the drive pulse for obtaining the necessary heat generation amount from the light source 116 according to the temperature of the ToF sensor 110 or the ambient temperature of the ToF sensor 110 acquired from the temperature sensor 112.

The drive pulse P output by the computer 114 is applied to the light source driver 118. The light source driver 118 receives the drive pulse P, and causes the light source 116 to emit pulse light to blink at a constant cycle.

<Control of Camera Module 102>

The control of the camera module 102 is an example of a method of controlling the camera module of the present disclosure. The control of the camera module 102 includes a) light emission/heat generation process, b) reflected light detection process, c) heat conduction process, d) temperature detection process, and e) temperature control process.

a) Light Emission/Heat Generation Process of Light Source 116

In this light emission/heat generation process, the light source driver 118 pulse-drives the light source 116 under the control of the computer 114. The light source 116 emits pulse light by the drive pulse P and generates heat. Reflected light is obtained from a subject irradiated with light from the light source 116.

b) Reflected Light Detection Process

In the reflected light detection process, reflected light from the subject is detected by the ToF sensor 110, and the computer 114 acquires a detection output of the reflected light.

The computer 114 acquires the detection output from the ToF sensor 110 and outputs an image signal representing the subject.

c) Heat Conduction Process

In this heat conduction process, the heat H of the light source 116 is received by the lens holder 106 as a heat conduction member through the second circuit board 104-2. The heat H is conducted to the first heat retention chamber 134-1 and the second heat retention chamber 134-2 through the lens holder 106. As a result, the ToF sensor 110 and the surroundings of the ToF sensor 110 are heated and the temperature of the ToF sensor 110 and the temperature of the surroundings of the ToF sensor 110 are retained.

d) Temperature Detection Process

In this temperature detection process, temperature detection is performed by the temperature sensor 112. This temperature detection includes detection of a temperature of the ToF sensor 110 or detection of an ambient temperature of the ToF sensor 110.

e) Temperature Control Process

In this temperature control process, temperature monitoring, adjustment of the heat generation amount by the light source 116, and temperature control of the temperature of the ToF sensor 110 or the ambient temperature of the ToF sensor 110 are performed. The temperature monitoring is continuously performed by the computer upon receipt of temperature data from the temperature sensor 112 during operation of the camera module 102. The temperature range of the temperature monitoring includes both the temperature of the ToF sensor 110 and the ambient temperature of the ToF sensor 110.

The heat generation amount of the light source 116 is adjusted by increasing or decreasing the switching loss of the pulse-driven light source 116 while maintaining the light amount obtained from the light source 116 at a predetermined level. That is, the heat generation amount is increased by increasing the number of times the light is turned on while maintaining the light amount (average light amount at the time of blinking) at a predetermined level, and the heat generation amount is reduced by decreasing the number of times the light is turned on while maintaining the light amount at a predetermined level.

The heat H flowing from the lens holder 106 to the first heat retention chamber 134-1 and the second heat retention chamber 134-2 is controlled by adjusting the heat generation amount. As a result, the temperature of the ToF sensor 110 or the ambient temperature of the ToF sensor 110 can be controlled to a predetermined temperature or a predetermined temperature range.

f) Other Control Processes

The control of the camera module 102 includes a control process of stopping the operation of the camera module 102 when the temperature or the ambient temperature of the ToF sensor 110 decreases to a predetermined temperature or less or to a predetermined temperature range. This control includes, for example, a process of stopping the operation of the ToF sensor 110, disabling the capture of the output of the ToF sensor 110, or blocking the light of the light source 116. That is, by performing such control, it is possible to avoid inconveniences such as capture of inappropriate image information, and it is possible to improve the reliability of the camera module 102.

<Relationship Between Drive Pulse P and Heat Generation Amount of Light Source 116>

In a case where the above-described VCSEL used for the light source 116 is turned on by pulse driving (pulse lighting method), a simple decrease or increase in the number of times of turning on can adjust the switching loss, may affect the light amount obtained by the VCSEL, and may affect the performance of the camera module 102.

Therefore, focusing on the switching loss of the pulse drive, the switching loss may be adjusted by increasing or decreasing a lighting time while maintaining the light amount at driving of the light source 116 (average light amount at blinking of the light source 116). That is, in order to maintain the light amount at the driving, the current value by the drive pulse may be adjusted.

Figure 7:
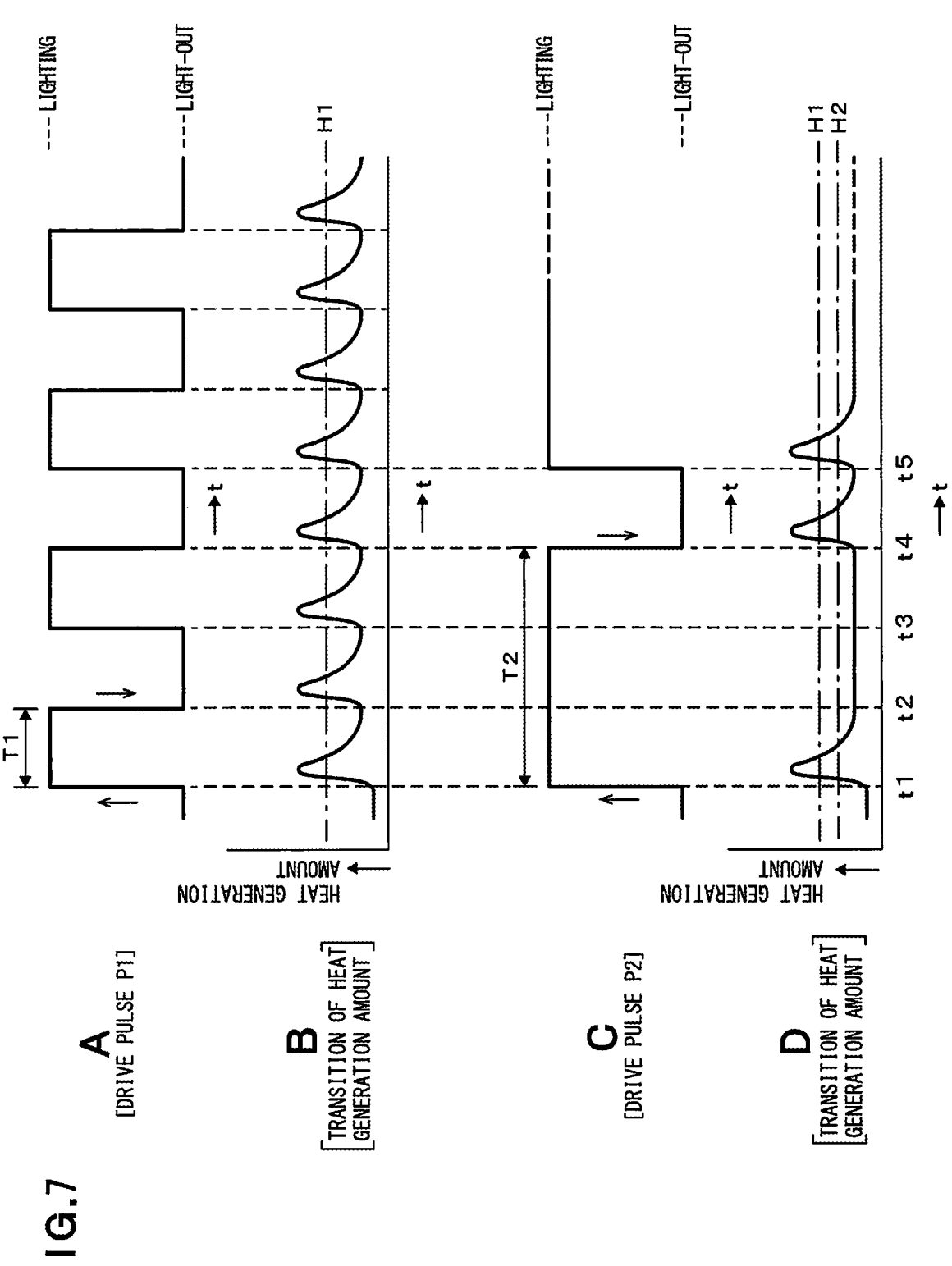
FIG. 7 is a diagram illustrating a drive pulse and a transition of a heat generation amount of a light source.

A of FIG. 7 illustrates pulse light emission including turning on and off of the light source 116 by the drive pulse P1. In this light emission mode, the light source 116 is blinked by a drive pulse P1 that oscillates between on and off at a constant cycle from the light source driver 118. T1 indicates a lighting time.

B of FIG. 7 illustrates a transition of the heat generation amount obtained from the light source 116 due to the switching loss by the drive pulse P1. In the light emission mode of the light source 116 by the drive pulse P1, a loss occurs both at the rise of the drive pulse P1 at the time points t1, t3, and t5 from light-out to the lighting of the light source 116 and at the fall of the drive pulse P1 at the time points t2 and t4 from the lighting to the light-out of the light source 116. When the switching is frequent, the heat generation amount H1 due to the switching loss increases.

C of FIG. 7 illustrates pulse light emission of the light source 116 by the drive pulse P2. The lighting time T2 by a drive pulse P2 is longer than the lighting time T1, and in this example, T2 is three times as long as T1.

D of FIG. 7 illustrates a transition of the heat generation amount obtained from the light source 116 due to the switching loss by the drive pulse P2. That is, in the turn-on mode of the light source 116 by the drive pulse P2, similar to the drive pulse P1, the loss occurs both at the rise of the drive pulse P2 at the time points t1 and t5 from the light-out to the lighting of the light source 116 and at the fall of the drive pulse P2 at the time point t4 from the lighting to the light-out of the light source 116. In the drive pulse P2, the switching interval is larger than that of the drive pulse P1, and the number of switching operations is small. Therefore, the heat generation amount H2 due to this switching loss is smaller than the heat generation amount H1. Although it is expected to vary depending on the extraction of the comparison target, according to the drive pulse P1 illustrated in A of FIG. 7 and the drive pulse P2 illustrated in C of FIG. 7 as an example, the heat generation amount H2 is $\frac{3}{5}$ times the heat generation amount H1.

<Control of Heat Generation Amount of Light Source 116>

For controlling the heat generation amount of the light source 116, adjustment of the heat generation amount generated due to the switching loss (heat loss) of the light source 116 when the light source 116 emits light by pulse driving is used. That is, loss adjustment by pulse-driven lighting is used.

Therefore, in the heat generation control, the temperature of the ToF sensor 110 or the ambient temperature of the ToF sensor 110 is constantly monitored, and the heat generation amount due to the switching loss of the light source 116 is increased or decreased according to the temperature transition, thereby controlling the temperature of the ToF sensor 110 or the ambient temperature of the ToF sensor 110 to a predetermined temperature or a predetermined temperature range.

<Relationship Among Input Power Pi to Light Source 116, Light Emission Power Pr of Light Source 116, and Loss Power Px>

In this power control, assuming that the input power to the light source 116 is Pi, the light emission power of the light source 116 is Pr, and the loss power is Px, the input power Pi can be expressed by Equation 1.

$$Pi = Pr + Px \qquad \text{(Equation 1)}$$

In Equation 1, the input power Pi is power applied from the light source driver 118 to the light source 116. The light emission power Pr is power used for light emission of the light source 116. The loss power Px is switching loss power of the light source 116.

The computer 114 monitors the input power Pi to the light source 116, the light emission power Pr, and the loss power Px, and performs power control for maintaining the light emission power Pr at a predetermined level or higher. Therefore, in this heat generation control, the amount of light obtained by the light source 116 is maintained at a predetermined level or higher, and the heat generation amount is adjusted by increasing or decreasing the switching loss of the light source 116.

<Example of Manufacturing Process of Camera Module 102>

The manufacturing process of the camera module 102 is an example of a method of manufacturing the camera module of the present disclosure. This manufacturing process includes a processing process of the lens holder 106 and a board attachment process, and further includes a process of installing the light source 116 that emits light and generates heat, a process of installing the ToF sensor 110 that detects reflected light from a subject that receives light from the light source 116, a process of installing the lens holder 106 (heat conduction member) that conducts heat of the light source 116 to the ToF sensor 110, a process of installing the temperature sensor 112 that detects a temperature of the ToF sensor 110 or detects an ambient temperature of the ToF sensor 110, a process of installing the computer 114 (control unit) that increases or decreases the heat generation amount of the light source 116 according to a temperature detected by the temperature sensor 112 and controls the temperature of the ToF sensor 110 or the ambient temperature of the ToF sensor 110 to a predetermined temperature or a predetermined temperature range, and the like.

In the processing process of the lens holder 106, the lens holder 106 including the vertical wall portions 124A, 124B, 124D, and 124F (first surrounding walls) that surround the ToF sensor 110 and the board mounting portion 122 (heat receiving portion) that receives the heat H of the light source 116 is formed by molding, cutting, or the like of the heat conduction member.

The board attachment process includes a process of disposing the first circuit board 104-1 on the first surrounding wall so as to position the ToF sensor 110 in the first surrounding wall, or a process of disposing the second circuit board 104-2 including the light source 116 on the board mounting portion 122 (heat receiving portion).

Effects of Second Embodiment

According to the second embodiment, any one of the following effects can be obtained.

(1) The light source 116 can be utilized as a heat retaining heat source.

The light source 116 is a light emitting unit for emitting light to irradiate a subject. Since heat generated by the original function is utilized as a heat retaining heat source, it is not necessary to install another heat source. This can contribute to simplification, multi-functionality or weight reduction of the module.

(2) Pulsed light emission can be utilized for the light emission mode of the light source 116.

It is possible to obtain heat H required as a heat retaining heat source by utilizing pulse drive light emission without impairing the light emission mode of the light source 116.

(3) Heat conduction by the heat conduction member can be used.

The lens holder 106 is a base material on which the lens unit 126 is mounted, and a heat conduction member is used for the lens holder 106. Therefore, the lens holder 106, which is a mounting member of the lens unit 126, can receive the heat H from the light source 116, and efficiently conduct the heat H to the ToF sensor 110 side. That is, multifunctionalization of the lens holder 106 can be achieved.

(4) The heat storage property, heat retention property, and detection accuracy can be improved.

The ToF sensor 110 and the computer 114 can be efficiently retained at a certain temperature or higher by utilizing the lens holder 106 constituting the first heat retention chamber 134-1 and the second heat retention chamber 134-2 and the heat storage property of the air confined in the first heat retention chamber 134-1 and the second heat retention chamber 134-2, and malfunction such as disturbance of a detection image due to temperature decrease of the ToF sensor 110 can be prevented, and detection accuracy can be enhanced.

(5) The operation temperature range of the camera module 102 can be expanded.

By retaining the temperature of the ToF sensor 110, the reliability of the sensor function of the ToF sensor 110 can be enhanced, the temperature dependence of the camera module 102 by the ToF sensor 110 can be alleviated, and the range of the operation temperature of the camera module 102 can be expanded.

(6) It is possible to enhance the heat retention property by heat generation of the light source 116, the heat dissipation property of the heat sink 108, and heat retention controllability property.

The temperature of each of the first heat retention chamber 134-1 and the second heat retention chamber 134-2 is optimized by the heat retention control including the heat dissipation of the heat sink 108 in combination with the temperature retention of the heat H from the light source 116, and the reliability of the operation can be enhanced together with the expansion of the range of the operation temperature of the camera module 102.

(7) The control of the computer 114 may include a control or a process of operating the ToF sensor 110 or enabling capture of the output of the ToF sensor 110 when the temperature or the ambient temperature of the ToF sensor 110 reaches a predetermined temperature or a predetermined temperature range.

(8) The heat dissipation of the heat sink 108 can be utilized.

Since the temperature of each of the first heat retention chamber 134-1 and the second heat retention chamber 134-2 is optimized by the heat dissipation of the heat sink 108 in combination with the temperature retention of the heat H from the light source 116, the reliability of the operation can be obtained together with the expansion of the range of the operation temperature of the camera module 102.

(9) The robustness and the like of the camera module 102 can be enhanced.

Since the first circuit board 104-1 and the second circuit board 104-2 are attached to the lens holder 106 formed of a heat conduction member having high rigidity, and the first circuit board 104-1 and the second circuit board 104-2 are disposed with the lens holder 106 interposed therebetween, the robustness of the camera module 102 can be enhanced.

Since the lens holder 106 has the box-shaped housing structure including the vertical wall portions 124A, 124B, 124D, and 124F (first surrounding wall) and the vertical wall portions 124B, 124C, 124E, and 124G (second surrounding wall), a strong support frame structure can be realized together with the rigidity of the heat conduction member.

According to the lens holder 106 including the vertical wall portions 124A, 124B, 124D, and 124F (first surrounding walls) surrounding the ToF sensor 110, reliability of the sensor function can be enhanced, for example, noise light can be blocked for the ToF sensor 110, and detection accuracy of reflected light from a subject can be enhanced.

(10) The installation accuracy of the ToF sensor 110 and the light source 116 can be improved.

By providing the lens holder 106 having the plurality of vertical wall portions 124A, 124B, 124D, and 124F (first surrounding wall) and the vertical wall portions 124B, 124C, 124E, and 124G (second surrounding wall), parallel accuracy of the first circuit board 104-1 and the second circuit board 104-2 can be obtained, and installation accuracy of the ToF sensor 110 and the light source 116 can be enhanced.

(11) The camera module 102 can be made compact.

The heat conduction structure can be realized using the lens holder 106, and the camera module 102 can be made compact.

(12) The temperature retention of the ToF sensor 110 can be optimized by the disposition of the first heat retention chamber 134-1 and the light source 116.

Since the ToF sensor is retained the temperature together with the first heat retention chamber 134-1 by the heat from the light source 116 disposed in the vicinity of the first heat retention chamber 134-1, the temperature retention can be optimized without excessively heating the ToF sensor 110.

EXAMPLE

Figure 8:
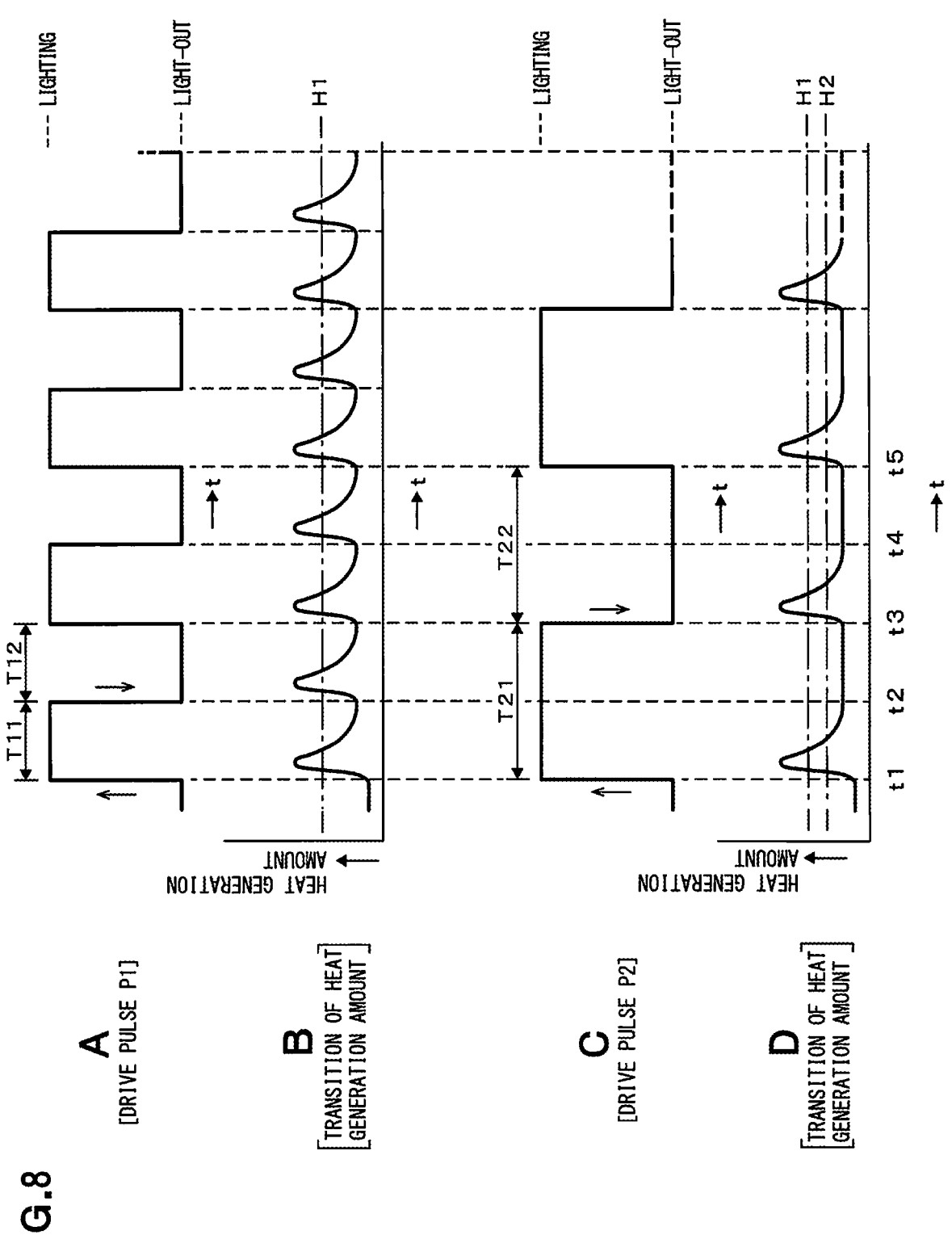
FIG. 8 is a diagram illustrating a drive pulse and a transition of a heat generation amount of a light source according to one example.

FIG. 8 illustrates a drive pulse and a transition of the heat generation amount of the light source 116 according to an example. This example is one example of control that can increase or decrease the switching loss of the light source 116 by the drive pulse while maintaining the light emission amount of the light source 116 at a constant amount.

A of FIG. 8 illustrates pulse light emission including turning on and off of the light source 116 by the drive pulse P1. In this light emission mode, the light source 116 is blinked by a drive pulse P1 that oscillates between on and off at a constant cycle from the light source driver 118. T11 indicates a lighting time, and T12 indicates a light-out time.

B of FIG. 8 illustrates a transition of the heat generation amount obtained from the light source 116 due to the switching loss by the drive pulse P1. In the light emission mode of the light source 116 by the drive pulse P1, in the section from the time point t1 to the time point t5, the loss occurs both at the rise of the drive pulse P1 at the time points t1, t3, and t5 from light-out to lighting of the light source 116 and at the fall of the drive pulse P1 at the time points t2 and t4 from the lighting to the light-out of the light source 116. As described above, this switching loss increases the heat generation amount H1 when switching is frequent. In this example, there are five times of switching in the time from the time point t1 to the time point t5, and the heat generation amount H1 according to the switching loss is obtained in the light source 116 according to the number of times of switching.

C of FIG. 8 illustrates pulse light emission of the light source 116 by the drive pulse P2. The lighting time T21 by the drive pulse P2 is longer than the lighting time T11, and in this example, the lighting time T21 and the light-out time T22 are as shown in Equations 2 and 3.

$$T21 = T11 \times 2 \tag{Equation 2}$$

$$T22 = T12 \times 2 \tag{Equation 3}$$

D of FIG. 8 illustrates a transition of the heat generation amount obtained from the light source 116 due to the switching loss by the drive pulse P2. In the turn-on mode of the light source 116 by the drive pulse P2, in the section from the time point t1 to the time point t5, similar to the drive pulse P1, the loss occurs both at the rise of the drive pulse P2 at the time points t1 and t5 from the light-out to the lighting of the light source 116 and at the fall of the drive pulse P2 at the time point t3 from the lighting to the light-out of the light source 116. In this switching loss, since the switching interval in the drive pulse P2 is larger than that of the drive pulse P1, the heat generation amount H2 is smaller than the heat generation amount H1.

In the section from time point t1 to time point t5, in the case of A of FIG. 8, the lighting time T11 exists twice. The lighting time T21 in the case of C of FIG. 8 is twice the lighting time T11 in the case of A of FIG. 8. Therefore, in the section from the time point t1 to the time point t5, the lighting time in the case of C of FIG. 8 is equivalent to the lighting time in the case of A of FIG. 8, and thus, in the case of C of FIG. 8, the light source 116 can obtain a light emission amount (average light amount at the time of blinking) similar to the light emission amount in the case of A of FIG. 8. On the other hand, in the section from the time point t1 to the time point t5, an increase of four times is obtained in the transition of the heat generation amount shown in B of FIG. 8, whereas an increase of two times is obtained in the transition of the heat generation amount shown in D of FIG. 8. That is, the number of increases in the heat generation amount decreases. As a result, the heat generation amount H2 obtained by the light source 116 is reduced to half the heat generation amount H1.

In this manner, it is possible to control the heat generation amount of the light source 116 by increasing or decreasing the switching loss of the light source 116 by the drive pulse while maintaining the light emission amount of the light source 116 at a constant amount. When the total lighting time is the same, the light amount does not change, and therefore the heat generation amount by the light source 116 can be adjusted only by the number of times of switching. That is, in the camera module 102, keeping the light amount of the light source 116 constant means keeping a constant measurement distance, and the reliability of the sensor function can be maintained.

OTHER EMBODIMENTS (1) Although a single light source 14 or a single light source 116 is provided in the above embodiment, a plurality of light sources 14 or a plurality of light sources 116 may be provided. Although the pulse light emission has been exemplified as the light emission mode of the light source 14 or the light source 116, a light emission mode other than the pulse light emission may be used.

(2) When the switching loss is increased or decreased, the light emission amount of the light source 14 or the light source 116 may be adjusted to a constant amount by adjusting the level of the drive pulse.

(3) In the above embodiment, light source 14 or light source 116 is used as the heat source. However, an element that generates heat during operation may be used as the heat source.

(4) Although the camera module 2 or the camera module 102 has been exemplified as the electronic device, the electronic device of the present disclosure is not limited to the camera module.

(5) The ToF sensor 110 and the control system 138 may be separate configurations, and the control system 138 may be mounted on the ToF sensor 110.

Aspects of the camera module, the control method, the manufacturing method, or the electronic device extracted from the object of the present disclosure and the above-described embodiments and examples are as follows.

A first object of the present disclosure is to expand a range of an operation temperature of a camera module by retaining a temperature of a ToF sensor by using heat of a light source.

A second object of the present disclosure is to expand an operation temperature range of a camera module by obtaining a heat quantity according to a temperature of a ToF sensor or an ambient temperature of a ToF sensor to retain the temperature of the ToF sensor.

A third object of the present disclosure is to expand a range of an operation temperature of an electronic device by retaining a temperature of an element whose function deteriorates at a low temperature by heat generated during operation.

A fourth object of the present disclosure is to expand an operation temperature range of an electronic device by retaining a temperature of an element whose function deteriorates at a low temperature by using heat of the element that generates heat during operation as a heat source.

For example, in order to achieve the first object or the second object, a camera module of the present disclosure includes a light source configured to emit light and generate heat; a ToF sensor configured to detect reflected light from a subject that receives the light from the light source; and a heat conduction member that conducts the heat of the light source to the ToF sensor.

In this camera module, the heat conduction member may include a first surrounding wall that surrounds the ToF sensor and a heat receiving portion that receives the heat from the light source, and conduct the heat to the ToF sensor.

In this camera module, the heat conduction member may include a first surrounding wall and a second surrounding wall adjacent to the first surrounding wall, the second surrounding wall surrounding a sensor circuit.

This camera module may include a heat sink, wherein the ToF sensor may be disposed between the heat conduction member and the heat sink, and the heat of the light source may be conducted to the ToF sensor through the heat conduction member and dissipated by the heat sink.

In this camera module, the heat conduction member may include a first heat retention chamber including a first surrounding wall, and the light source may be disposed in the vicinity of the first heat retention chamber.

In this camera module, the first heat retention chamber may include a lens unit in a sealing member that seals the first heat retention chamber.

The camera module may further include a temperature sensor configured to detect a temperature of the ToF sensor or detect an ambient temperature of the ToF sensor; and a control unit configured to increase or decrease a heat generation amount of the light source according to a detection temperature of the temperature sensor and control the temperature of the ToF sensor or the ambient temperature of the ToF sensor to a predetermined temperature or a predetermined temperature range.

In this camera module, the control unit may increase or decrease the heat generation amount due to a switching loss of the light source by a drive pulse.

In order to achieve the first object or the second object, a method for controlling a camera module according to the present disclosure includes: emitting light and generating heat by a light source; detecting reflected light from a subject by a ToF sensor; conducting the heat of the light source to the ToF sensor by a heat conduction member; detecting a temperature of the ToF sensor or detecting an ambient temperature of the ToF sensor by a temperature sensor; and controlling, by a control unit, the temperature of the ToF sensor or the ambient temperature of the ToF sensor to a predetermined temperature or a predetermined temperature range by increasing or decreasing a heat generation amount of the light source according to a detection temperature of the temperature sensor.

In the method for controlling the camera module, the controlling the temperature or the ambient temperature to the predetermined temperature or the predetermined temperature range may include increasing or decreasing the heat generation amount due to a switching loss of the light source by a drive pulse.

In the method for controlling the camera module, the controlling the temperature or the ambient temperature to the predetermined temperature or the predetermined temperature range may include increasing or decreasing the heat generation amount of the light source while maintaining a light emission amount of the light source at a constant amount by increasing or decreasing a level of a drive pulse.

The method for controlling the camera module may include stopping an operation of the camera module when the temperature or the ambient temperature of the ToF sensor decreases to a predetermined temperature or less or to a predetermined temperature range.

In order to achieve the first object or the second object, a method for manufacturing a camera module of the present disclosure includes: forming a heat conduction member including a first surrounding wall for surrounding a ToF sensor and a heat receiving portion for receiving heat of a light source; and disposing a first circuit board on the first surrounding wall so as to position the ToF sensor in the first surrounding wall, or disposing a second circuit board including the light source on the heat receiving portion.

The method for manufacturing the camera module may further include: installing the light source configured to emit light and generate the heat; installing the ToF sensor configured to detect reflected light from a subject that receives the light from the light source; installing the heat conduction member for conducting the heat of the light source to the ToF sensor, installing a temperature sensor configured to detect a temperature of the ToF sensor or detect an ambient temperature of the ToF sensor; and installing a control unit configured to increase or decrease a heat generation amount of the light source according to a detection temperature of the temperature sensor and control the temperature of the ToF sensor or the ambient temperature of the ToF sensor to a predetermined temperature or a predetermined temperature range.

For example, in order to achieve the third object or the fourth object, according to the electronic device of the present disclosure, there is provided an electronic device in which a first element whose function deteriorates at a low temperature and a second element that generates heat during operation coexist, the electronic device including a heat conduction member that conducts heat of the second element to the first element side to retain a temperature of the first element.

The electronic device may further include: a temperature sensor that detects a temperature of the first element or detects an ambient temperature of the first element; and a control unit that controls the temperature of the first element or the ambient temperature of the first element to a predetermined temperature or a predetermined temperature range by increasing or decreasing a heat generation amount of the second element according to a detection temperature of the temperature sensor.

According to the aspects of the above embodiment and examples, any of the following effects can be obtained.

(1) According to the camera module, the heat of the light source can be conducted by the heat conduction member to retain the temperature of the ToF sensor, and malfunction due to the operation temperature of the ToF sensor and the operation temperature dependency of the ToF sensor can be eliminated, and the range of the operation temperature of the camera module can be expanded.

(2) According to the camera module, the temperature or the ambient temperature of the ToF sensor can be controlled to the predetermined temperature or the predetermined temperature range by increasing or decreasing the heat obtained from the light source according to the temperature or the ambient temperature of the ToF sensor, and therefore it is possible to prevent malfunction of the ToF sensor at a low temperature.

(3) According to the method for controlling the camera module, the operation temperature dependency by the ToF sensor can be eliminated, and the temperature range in which the normal operation can be performed can be expanded.

(4) According to the method for manufacturing the camera module, it is possible to manufacture the camera module in which the imaging function is not limited by the operation temperature of the ToF sensor.

(5) According to the method for manufacturing the camera module, it is possible to manufacture the camera module in which the operation temperature dependency of the ToF sensor is eliminated and the usable temperature range is expanded.

(6) According to the electronic device, since the temperature of the first element exhibiting an operation failure at a low temperature can be retained by the heat obtained from the second element, it is possible to eliminate the malfunction due to the operation temperature of the first element and the operation temperature dependency of the light receiving element, and it is possible to expand the range of the operation temperature of the electronic device.

(7) According to the electronic device, since the heat obtained from the second element can be increased or decreased according to the temperature of the first element or the ambient temperature of the first element, and the temperature of the first element or the ambient temperature of the first element can be controlled to the predetermined temperature or the predetermined temperature range, it is possible to prevent the malfunction of the first element due to the low temperature.

(8) According to the electronic device, it is possible to eliminate the operation temperature dependence of the first element, and it is possible to expand the operation temperature range of the electronic device including the first element.

As described above, the most preferred embodiment and the like of the present disclosure have been described. The present disclosure is not limited to the above description. It goes without saying that various modifications and changes can be made by those skilled in the art based on the gist of the present disclosure described in the claims or the description, and such modifications and changes are included in the scope of the present disclosure.

In the present disclosure, for an electronic device such as the camera module 2 or the camera module 102 in which the ToF sensor 10 (first element) or the ToF sensor 110 (first element) causing functional degradation at low temperature and the light source 14 or the light source 116 (second element) generating heat at the time of operation coexist, heat of the second element is conducted to the first element side to retain a temperature of the first element, and therefore it is possible to obtain an excellent effect such as expansion of a range of an operation temperature of the electronic device such as the camera module 2 or the camera module 102.

The invention claimed is:

1. A camera module comprising:
a light source configured to emit light and generate heat;
a ToF sensor configured to detect reflected light from a subject that receives the light from the light source; and
a heat conduction member that conducts the heat of the light source to the ToF sensor, wherein the heat conduction member includes a first surrounding wall that surrounds the ToF sensor and a heat receiving portion that receives the heat from the light source, and conducts the heat to the ToF sensor.

2. The camera module according to claim 1, wherein the heat conduction member includes a first surrounding wall and a second surrounding wall adjacent to the first surrounding wall, the second surrounding wall surrounding a sensor circuit.

3. The camera module according to claim 1, further comprising:
a heat sink,
wherein the ToF sensor id disposed between the heat conduction member and the heat sink, and the heat of the light source is conducted to the ToF sensor through the heat conduction member and dissipated by the heat sink.

4. The camera module according to claim 1, wherein the heat conduction member includes a first heat retention chamber including a first surrounding wall, and the light source is disposed in the vicinity of the first heat retention chamber.

5. The camera module according to claim 1, wherein the first heat retention chamber includes a lens unit in a sealing member that seals the first heat retention chamber.

6. The camera module according to claim 1, further comprising:
a temperature sensor configured to detect a temperature of the ToF sensor or detect an ambient temperature of the ToF sensor; and
a control unit configured to increase or decrease a heat generation amount of the light source according to a detection temperature of the temperature sensor and control the temperature of the ToF sensor or the ambient temperature of the ToF sensor to a predetermined temperature or a predetermined temperature range.

7. The camera module according to claim 1, wherein the control unit increases or decreases the heat generation amount due to a switching loss of the light source by a drive pulse.

8. A method for controlling a camera module, comprising:
emitting light and generating heat by a light source;
detecting reflected light from a subject by a ToF sensor;
conducting the heat of the light source to the ToF sensor by a heat conduction member, wherein the heat conduction member includes a first surrounding wall that surrounds the ToF sensor and a heat receiving portion that receives the heat from the light source, and conducts the heat to the ToF sensor;
detecting a temperature of the ToF sensor or detecting an ambient temperature of the ToF sensor by a temperature sensor; and controlling, by a control unit, the temperature of the ToF sensor or the ambient temperature of the ToF sensor to a predetermined temperature or a predetermined temperature range by increasing or decreasing a heat generation amount of the light source according to a detection temperature of the temperature sensor.

9. The method for controlling the camera module according to claim 8, wherein the controlling the temperature or the ambient temperature to the predetermined temperature or the predetermined temperature range includes increasing or decreasing the heat generation amount due to a switching loss of the light source by a drive pulse.

10. The method for controlling the camera module according to claim 8, wherein the controlling the temperature or the ambient temperature to the predetermined temperature or the predetermined temperature range includes increasing or decreasing the heat generation amount of the light source while maintaining a light emission amount of the light source at a constant amount by increasing or decreasing a level of a drive pulse.

11. The method for controlling the camera module according to claim 9, wherein the controlling the temperature or the ambient temperature to the predetermined temperature or the predetermined temperature range includes increasing or decreasing the heat generation amount of the light source while maintaining a light emission amount of the light source at a constant amount by increasing or decreasing a level of a drive pulse.

12. The method for controlling the camera module according to claim 8, further comprising stopping an operation of the camera module when the temperature or the ambient temperature of the ToF sensor decreases to a predetermined temperature or less or to a predetermined temperature range.

13. The method for controlling a camera module according to claim 9, further comprising stopping an operation of the camera module when the temperature or the ambient temperature of the ToF sensor decreases to a predetermined temperature or less to a predetermined temperature range.

14. A method for manufacturing a camera module, comprising:
forming a heat conduction member including a first surrounding wall for surrounding a ToF sensor and a heat receiving portion for receiving heat of a light source; and
disposing a first circuit board on the first surrounding wall so as to position the ToF sensor in the first surrounding wall, or disposing a second circuit board including rhe light source on the heat receiving portion.

15. The method for manufacturing the camera module according to claim 14, further comprising:
installing the light source configured to emit light and generate the heat;
installing the ToF sensor configured to detect reflected light from a subject that receives the light from the light source;
installing the heat conduction member for conducting the heat of the light source to the ToF sensor,
installing a temperature sensor configured to detect a temperature of the ToF sensor or detect an ambient temperature of the ToF sensor; and
installing a control unit configured to increase or decrease a heat generation amount of the light source according to a detection temperature of the temperature sensor and control the temperature of the ToF sensor or the ambient temperature of the ToF sensor to a predetermined temperature or a predetermined temperature range.

* * * * *